(12) United States Patent
Ueda et al.

(10) Patent No.: US 8,259,459 B2
(45) Date of Patent: Sep. 4, 2012

(54) ELECTRONIC DEVICE

(75) Inventors: Satoshi Ueda, Kawasaki (JP); Takeo Takahashi, Yokohama (JP); Tsuyoshi Matsumoto, Kawasaki (JP); Tsuyoshi Yokoyama, Kawasaki (JP); Xiaoyu Mi, Kawasaki (JP)

(73) Assignees: Taiyo Yuden Co., Ltd., Tokyo (JP); Fujitsu Limited, Kawasaki (JP)

( * ) Notice: Subject to any disclaimer, the term of this patent is extended or adjusted under 35 U.S.C. 154(b) by 711 days.

(21) Appl. No.: 12/239,202

(22) Filed: Sep. 26, 2008

(65) Prior Publication Data

US 2009/0237894 A1 Sep. 24, 2009

(30) Foreign Application Priority Data

Sep. 28, 2007 (JP) .................................. 2007-254661

(51) Int. Cl.
*H05K 7/02* (2006.01)
*H05K 7/06* (2006.01)
*H05K 7/08* (2006.01)
*H05K 7/10* (2006.01)

(52) U.S. Cl. ......... 361/760; 361/736; 361/737; 361/767

(58) Field of Classification Search .......... 361/736–737; 343/866–870
See application file for complete search history.

(56) References Cited

U.S. PATENT DOCUMENTS

| | | | | |
|---|---|---|---|---|
| 5,420,757 | A | * | 5/1995 | Eberhardt et al. ............ 361/813 |
| 6,388,636 | B1 | * | 5/2002 | Brown et al. .................. 343/866 |
| 6,518,165 | B1 | | 2/2003 | Yoon et al. |
| 6,885,354 | B2 | * | 4/2005 | Takei ............................. 343/870 |
| 2003/0184495 | A1 | * | 10/2003 | Tomon .......................... 343/895 |
| 2006/0114077 | A1 | | 6/2006 | Mizuno et al. |
| 2007/0045773 | A1 | | 3/2007 | Mi et al. |

FOREIGN PATENT DOCUMENTS

| | | |
|---|---|---|
| JP | 04-228135 | 8/1992 |
| JP | 11-154730 A | 6/1999 |
| JP | 2001-044105 A | 2/2001 |
| JP | 2001-326517 A | 11/2001 |
| JP | 2004-140587 | 5/2004 |
| JP | 2005-045161 | 2/2005 |
| JP | 2006-157738 A | 6/2006 |
| JP | 2007-067236 A | 3/2007 |

OTHER PUBLICATIONS

Japanese Office Action dated Jan. 10, 2012, corresponding to Japanese Patent Application No. 2007-254661.

* cited by examiner

*Primary Examiner* — Tuan T Dinh
(74) *Attorney, Agent, or Firm* — Arent Fox LLP

(57) ABSTRACT

An electronic device includes a substrate, a coil that has a spiral shape and is provided on the substrate, and a conductive pattern that is provided inside of the coil, has optical reflectivity higher than that of a surface of the coil, and is divided into pieces.

7 Claims, 12 Drawing Sheets

ELECTRONIC DEVICE

BACKGROUND OF THE INVENTION

1. Field of the Invention

The present invention generally relates to an electronic device, and more particularly, to an electronic device having a conductive pattern.

2. Description of the Related Art

An inductor or a capacitor is used for phase matching or the like. For example, there is a demand for downsizing, low cost and high performance in a RF (Radio Frequency) system such as mobile phone or a wireless LAN (Local Area Network). An electronic device such as an integrated passive device where passive devices such as an inductor or a capacitor are integrated on a substrate is used in order to satisfy the demand.

It is effective that an integrated passive device is face-down mounted for high performance in a case where the integrated passive device is mounted on a package or a module substrate. A stud bump such as gold, a plated bump or a solder bump is formed on a pad to be connected to outside of the integrated passive device in order to face-down mount the integrated passive device. The stud bump is formed with a wire bonder. The solder bump is formed with a ball mounter. Next, the integrated passive device is mounted on a package or a module substrate with a flip-chip bonder.

Japanese Patent Application Publication No. 2006-157738 discloses an integrated electronic device that uses a spiral-shaped coil on a substrate as an inductor. Japanese Patent Application Publication No. 2007-67236 and U.S. Pat. No. 6,518,165 disclose an inductor where spiral-shaped coils are spaced from each other in a longitudinal direction thereof.

A marker for localization is formed in the integrated passive device in advance, when the bonder such as the wire bonder, the ball mounter or the flip-chip bonder is used. The stud bump or the solder bump is formed or flip-chip mounted with reference to the marker for localization in a case of bonding. The marker for localization is recognized with image recognition in the bonder. Therefore, it is demanded that size or contrast of the marker for localization is determined so that the bonder is image-recognized. It is therefore demanded that the size of the marker for localization is more than a given size and is a conductive pattern having high optical reflectivity. On the other hand, inductive current from the coil is generated in the marker for localization and eddy-current loss is generated and affects inductor property when the marker for localization is enlarged.

SUMMARY OF THE INVENTION

The present invention has been made in view of the above circumstances and provides an electronic device that has a conductive pattern, wherein the conductive pattern can be image recognized and influence of the conductive pattern on the inductor property is restrained.

According to an aspect of the present invention, there is provided an electronic device including a substrate, a coil that has a spiral shape and is provided on the substrate, and a conductive pattern that is provided inside of the coil, has optical reflectivity higher than that of a surface of the coil, and is divided into pieces.

With the structure, the conductive pattern can be image-recognized because the optical reflectivity of the conductive pattern is high. And it is possible to restrain an influence of the conductive pattern on the inductor property, because the conductive pattern is divided into pieces.

According to another aspect of the present invention, there is provided an electronic including a substrate, a coil that has a spiral shape and is provided on the substrate, and a conductive pattern that is provided in a range from a circumference to a middle of the coil, has an optical reflectivity higher than that of a surface of the coil, and acts as a marker for localization divided into pieces. The conductive pattern is for image recognition.

DESCRIPTION OF THE PREFERRED EMBODIMENTS

In order to facilitate better understanding of the present invention, a description will now be given of related art.

A large marker for localization is a barrier against chip area reduction of an integrated passive device. And so, the marker for localization may be arranged inside of the coil of an inductor. It has been confirmed that inductance and Q value (sharpness) of an inductor are reduced if the marker for localization is inside of the inductor coil. A description will be given of an example and a first embodiment to solve the problem.

Figure 1:
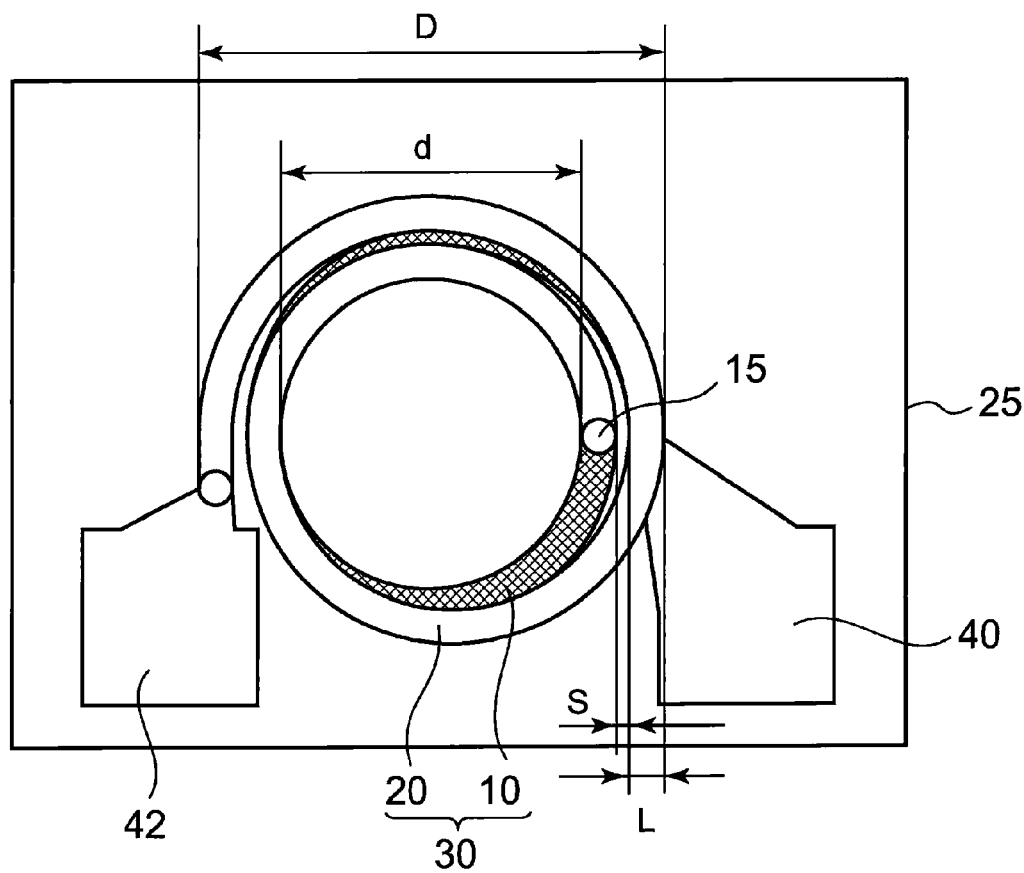
FIG. 1 illustrates a top view of an inductor device in accordance with a first comparative embodiment.
Figure 2:
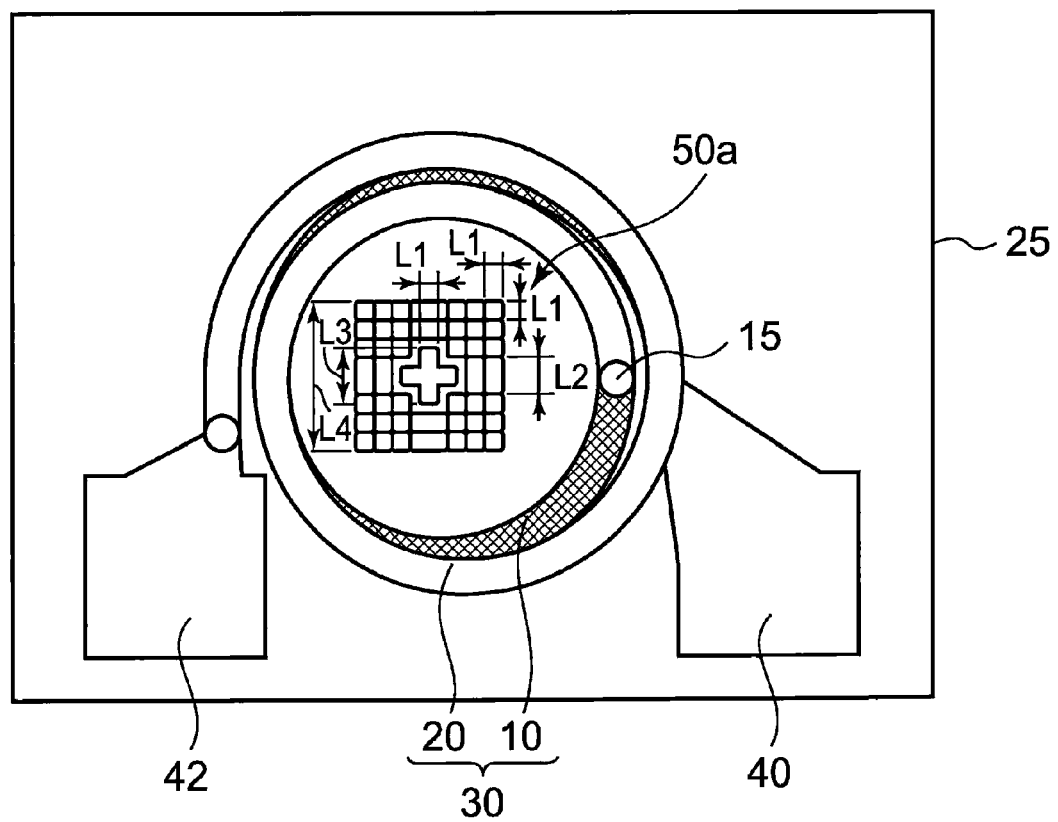
FIG. 2 illustrates a top view of an inductor device in accordance with a first embodiment.
Figure 3:
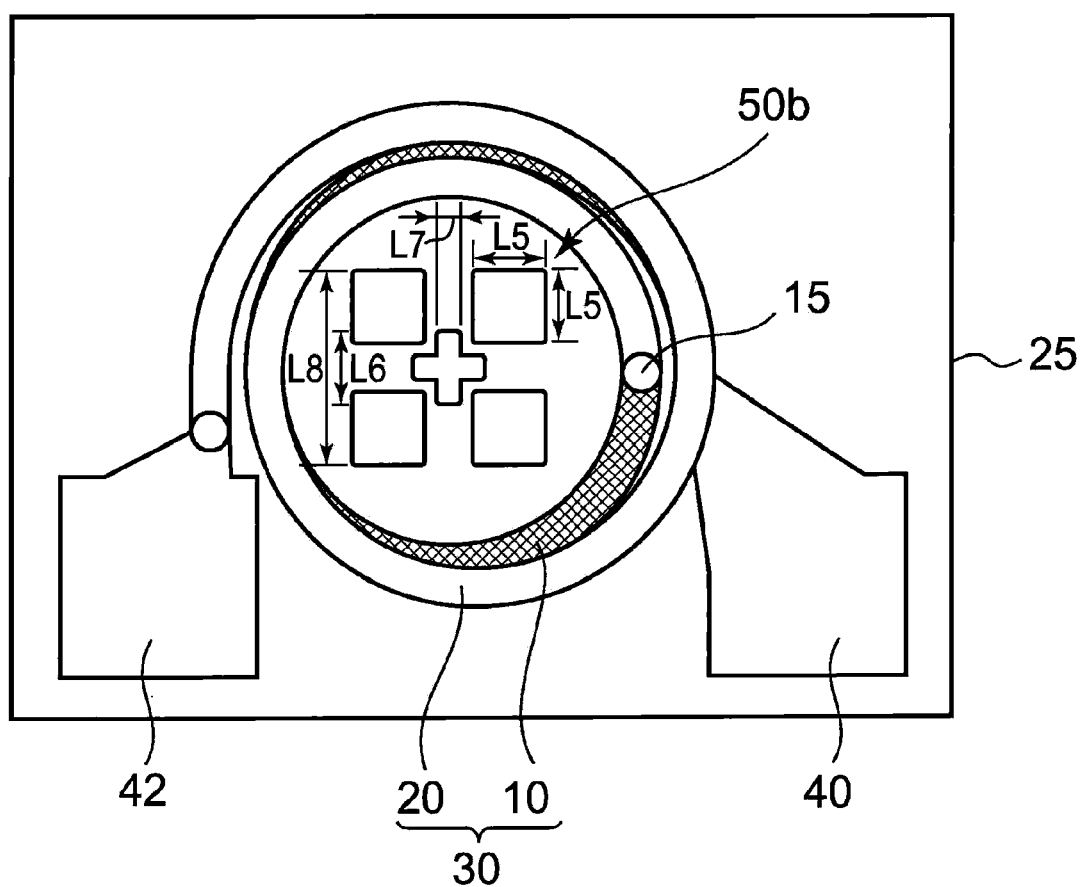
FIG. 3 illustrates a top view of an inductor device in accordance with a variant embodiment of the first embodiment.
Figure 4:
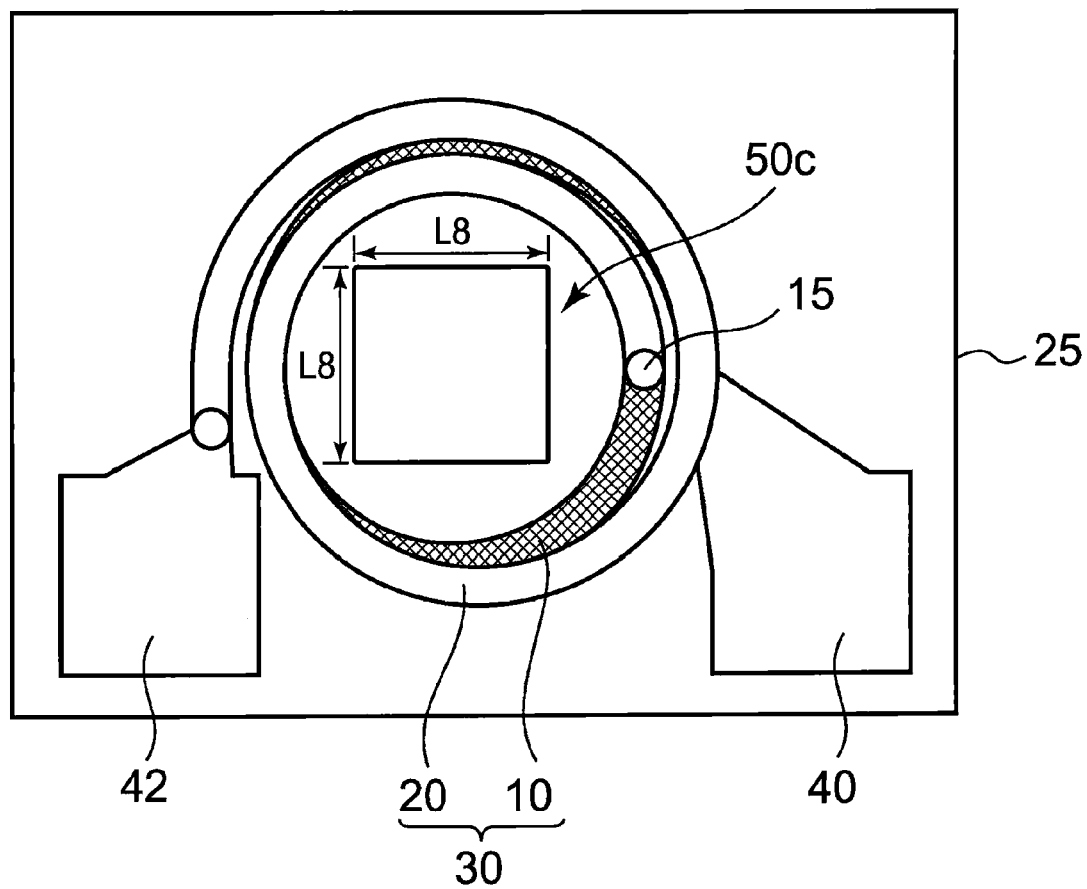
FIG. 4 illustrates a top view of an inductor device in accordance with a second comparative embodiment.

FIG. 1 through FIG. 4 illustrate a top view of an inductor device manufactured experimentally. FIG. 1 illustrates an inductor device in accordance with a first comparative embodiment. FIG. 2 illustrates an inductor device in accordance with a first embodiment. FIG. 3 illustrates an inductor device in accordance with a variant embodiment of the first embodiment. FIG. 4 illustrates an inductor device in accordance with a second comparative embodiment. In FIG. 1 through FIG. 4, the inductor devices have the same structure. A description will be given of the manufactured inductor device with reference to FIG. 1. The inductor device has an inductor 30 and pads 40 and 42 on a glass substrate 25. The inductor 30 has a first coil 10 and a second coil 20 having a spiral shape. The spiral-shaped first coil 10 is provided on the substrate 25. The second coil 20 is provided on the first coil 10. The first coil 10 and the second coil 20 are spaced from each other. There is formed a space between the first coil 10 and the second coil 20. That is, air is filled between the first coil 10 and the second coil 20. The first coil 10 is almost overlapped with the second coil 20. The first coil 10 is connected to the pad 40 at the outermost circumference thereof and has a single spiral. The second coil 20 is connected to the pad 42 at the outermost circumference thereof and has a 1.5 spiral. The first coil 10 and the second coil 20 are connected to each other with a connection portion 15 at the innermost circumference thereof. The inductor 30 has outer diameter D of 480 μm, inner diameter d of 300 μm, wire width L of 40 μm and wire interval S of 10 μm.

As shown in FIG. 2, there is formed a conductive pattern 50a acting as a marker for localization inside of inner diameter of the inductor 30 in the inductor device in accordance with a first embodiment. The conductive pattern 50a has 36 square patterns 15 μm on a side L1, 8 rectangular patterns having a side L1 of 15 μm and a side L2 of 30 μm, and one cross pattern in a center thereof having a minimum width L1 of 15 μm and a maximum width L3 of 70 μm. An interval is 5 μm between the square pattern and the rectangular pattern. An outer side L4 of the conductive pattern 50a is 150 μm.

As shown in FIG. 3, there is formed a conductive pattern 50b acting as a marker for localization inside of inner diameter of the inductor 30 in the inductor device in accordance with a variant embodiment of the first embodiment. The conductive pattern 50b has 4 square patterns 65 μm on a side L5 and one cross pattern in a center thereof having a minimum width L7 of 25 μm and a maximum width L6 of 75 μm. An interval is 50 μm between each of the square patterns. An outer side L8 of the conductive pattern 50b is 180 μm.

As shown in FIG. 4, there is formed a conductive pattern 50c acting as a marker for localization inside of inner diameter of the inductor 30 in the inductor device in accordance with the first embodiment. The conductive pattern 50c is a square pattern 180 μm on a side L8. The first coil 10 and the second coil 20 are made of plated copper having thickness of approximately 10 μm. On the other hand, the conductive patterns 50a through 50c has a structure in which gold of 1000 nm is laminated on titanium of 20 nm formed with a sputtering method. The first coil 10 and the second coil 20 have a surface with large uneven and has small optical reflectivity, because the first coil 10 and the second coil 20 are formed with a plating method. On the other hand, the conductive patterns 50a through 50c have large optical reflectivity, because the conductive patterns 50a through 50c are formed with the sputtering method and has a surface of gold.

Figure 5:
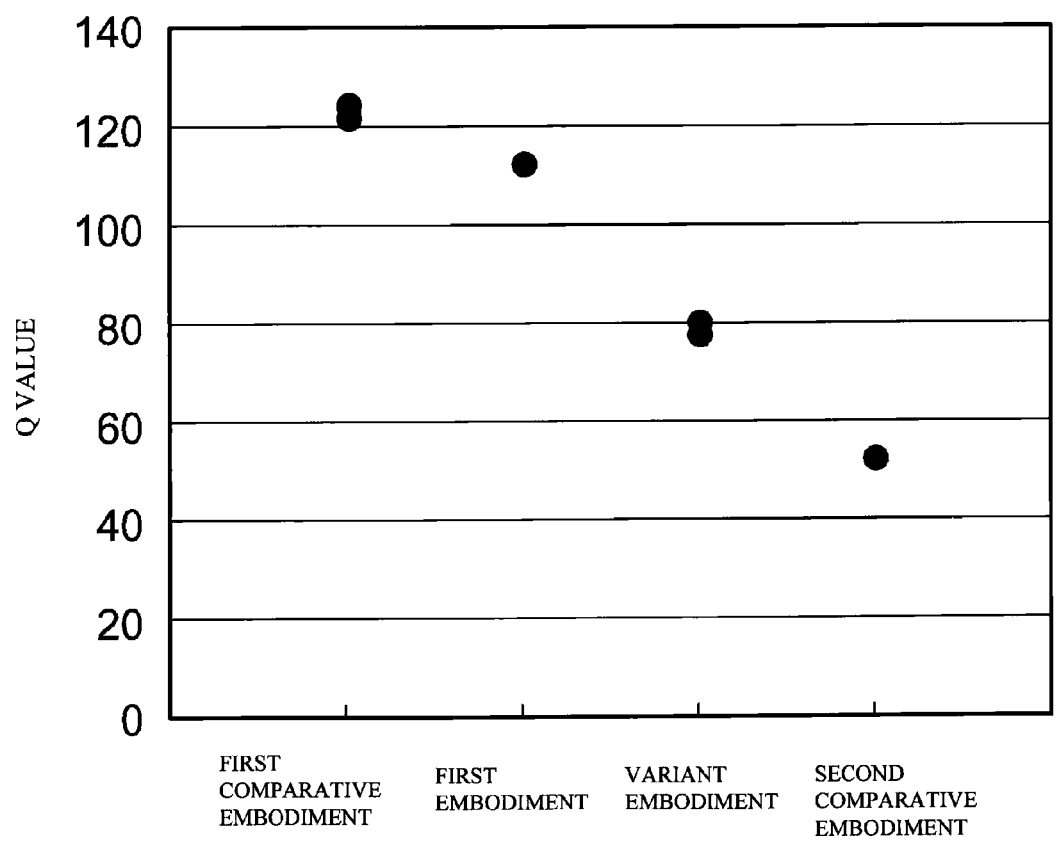
FIG. 5 illustrates Q value of the above-mentioned inductor devices.
Figure 6:
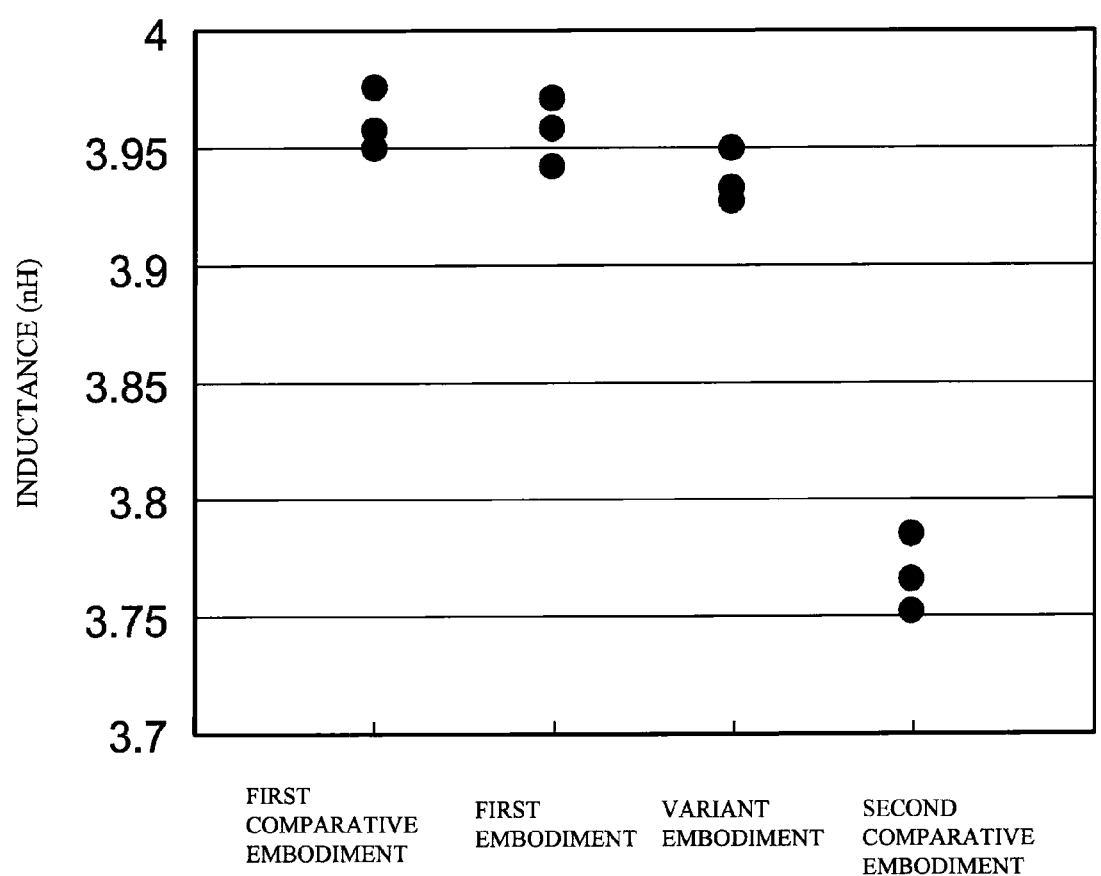
FIG. 6 illustrates inductance value of the above-mentioned inductor devices.

FIG. 5 illustrates measured Q values of the inductors in accordance with the first comparative embodiment, the first embodiment, the variant embodiment of the first embodiment and the second comparative embodiment. FIG. 6 illustrates measured inductance values of the above-mentioned inductors. In FIG. 5 and FIG. 6, illustrated dots with respect to the inductors are a measured result of one of the inductors.

As shown in FIG. 5, the Q value is the largest with respect to the first comparative embodiment and is the smallest with respect to the second comparative embodiment. The Q value of the first embodiment and the variant embodiment thereof is between the first comparative embodiment and the second comparative embodiment. As shown in FIG. 6, the inductance value is the largest with respect to the first comparative embodiment and is the smallest with respect to the second comparative embodiment. The inductance value of the first embodiment and the variant embodiment thereof is approximately the same as the first comparative embodiment.

The inductance device in accordance with the first comparative embodiment does not have a conductive pattern in the inductor 30 and has primary Q value and inductance value. In contrast, the inductor device in accordance with the second comparative embodiment has relatively small Q value and inductance value, because there is formed the conductive pattern in the inductor 30. This is because eddy-current loss is generated because of the arrangement of the conductive pattern 50c in the inductor 30. The conductive patterns 50a and 50b are divided into pieces in the first embodiment and the variant embodiment thereof. This results in restraint of the eddy-current generated in the conductive patterns 50a and 50b. The Q value and the inductance value of the inductor 30 is more improved than the second comparative embodiment.

In accordance with the first embodiment, a chip area of the conductive pattern 50a or the conductive pattern 50b may be reduced because the conductive pattern 50a or the conductive pattern 50b is formed in the first coil 10 and the second coil 20. It is therefore possible to restrain the influence of the conductive pattern 50a or the conductive pattern 50b on the inductor property as shown in FIG. 5 and FIG. 6, if the conductive pattern 50a or the conductive pattern 50b are divided into pieces. It is therefore possible to use the conductive patterns 50a and 50b integrally acting as the marker for localization, because the optical reflectivity of the conductive patterns 50a and 50b is higher than that of the first coil 10 and the second coil 20. The position of a wire bonder, a ball mounter or a flip chip bonder is recognized with an optical microscope. The divided pattern is recognized as an integral pattern when the optical reflectivity thereof is high. It is therefore possible to use the conductive patterns 50a and 50b as an integral pattern for image recognition.

[Second Embodiment]

Figure 7:
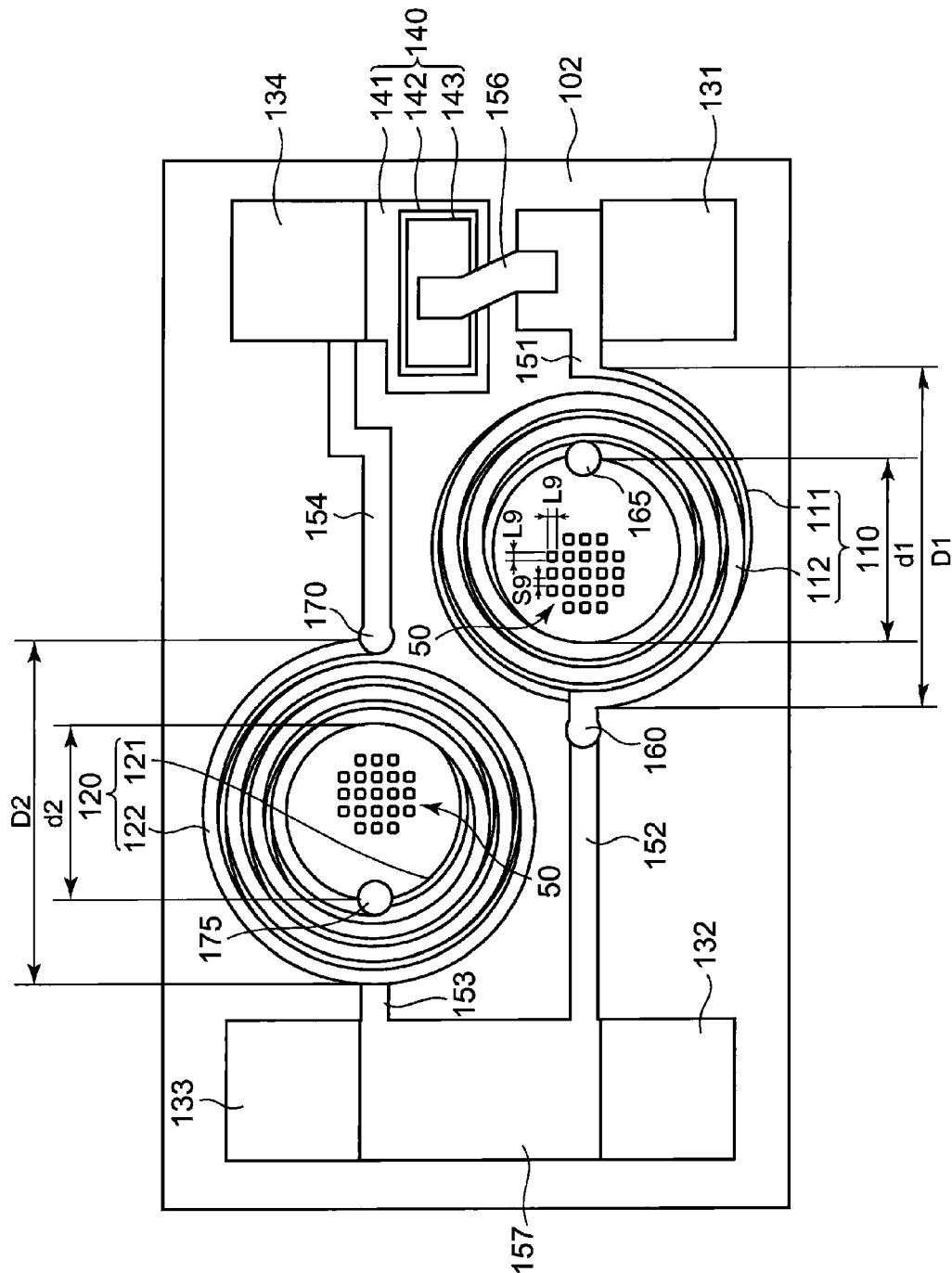
FIG. 7 illustrates a top view of an integrated passive device in accordance with a second embodiment.

A second embodiment is an example of an integrated passive device having an inductor and a capacitor. FIG. 7 illustrates a top view of the integrated passive device in accordance with the second embodiment. As shown in FIG. 7, there are provided an inductor 110 having a first coil 111 and a second coil 112 and an inductor 120 having a first coil 121 and a second coil 122. The inner end of the first coil 111 and the second coil 112 in the inductor 110 is electrically connected to each other through a connection portion 165. The outer end of the first coil 111 is connected to a wire 151. The outer end of the second coil 112 is electrically connected to a wire 152 through a connection portion 160. The inner end of the first coil 121 and the second coil 122 in the inductor 120 are connected to each other with a connection portion 175. The outer end of the first coil 121 is connected to a wire 153. The outer end of the second coil 122 is connected to a wire 154 through a connection portion 170. The wires 151 through 154 are formed on a substrate 102 and connected to pads 131 through 134 respectively. The pad 132 is connected to the pad 133 with a wire 157. A capacitor 140 having a lower electrode 141, a dielectric layer 142 and an upper electrode 143 is connected between the pad 131 and the pad 134. The upper electrode 143 is connected to the wire 151 with an upper wire 156. An integrated passive device forms a π type L-C-L circuit between the pad 131 and the pad 134, if the pad 131 acts as an input, the pad 134 acts as an output, and the pad 132 and the pad 133 are grounded. The inductor 110 has an outer diameter D1 of 350 μm and an inner diameter d1 of 200 μm. The inductor 120 has an outer diameter D2 of 400 μm and an inner diameter d2 of 190 μm. The first coils 111, 121 and the second coils 112, 122 have a wire width of 15 μm and a wire interval of 15 μm.

As shown in FIG. 7, there is formed a conductive pattern 50 in the second coils 112 and 122. The conductive pattern 50 has 21 square patterns 10 μm on a side L9 and has on outer diameter of 115 μm. An interval S9 between the square patterns is 10 μm.

The integrated passive devices in accordance with the second embodiment had been manufactured. The inductance value of the inductor 110 had corresponded to that of the inductor 120 with plus minus 5% accuracy of designed value. And high Q value had been obtained. The stud bump had been formed and the integrated passive device had been face-down mounted with use of the conductive pattern 50 without problem. It is therefore confirmed that the conductive pattern 50 may be used as a pattern for image recognition.

[Third Embodiment]

Figure 8A:
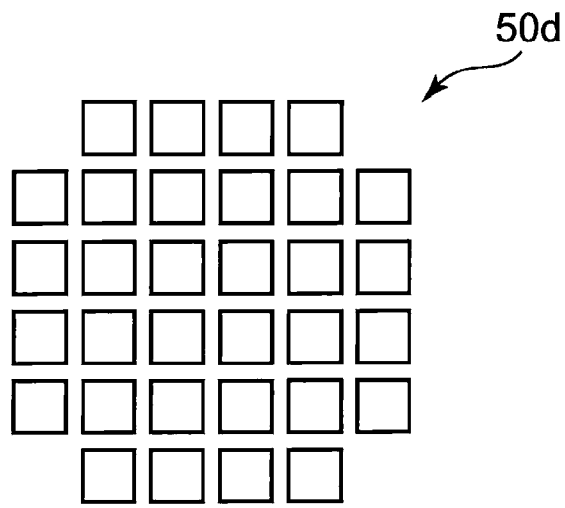
FIG. 8A through FIG. 8C illustrate a conductive pattern in accordance with a third embodiment.
Figure 8B:
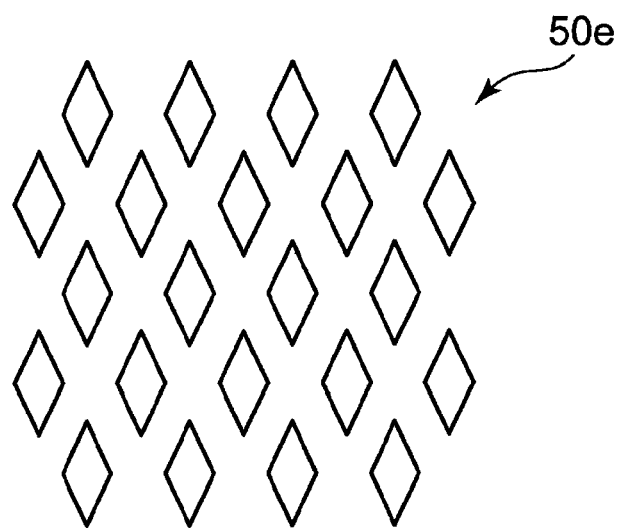
Figure 8C:
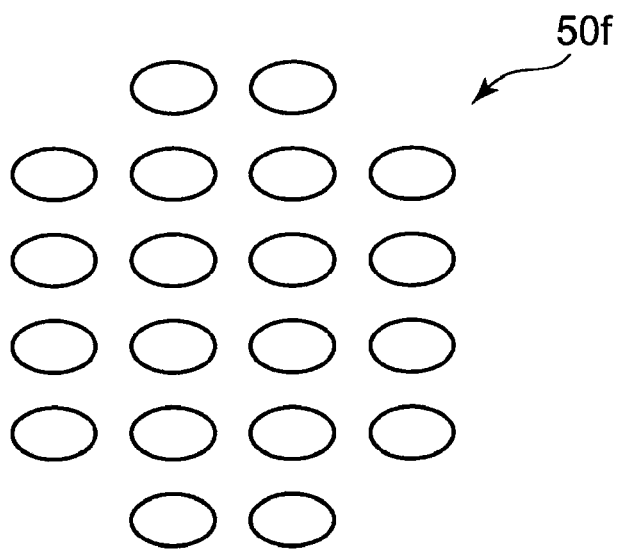
Figure 9A:
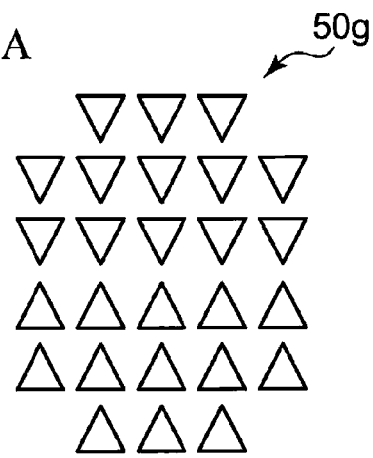
FIG. 9A through FIG. 9D illustrate the conductive pattern in accordance with the third embodiment.
Figure 9B:
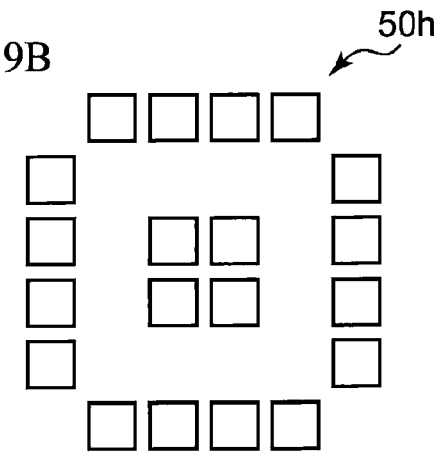
Figure 9C:
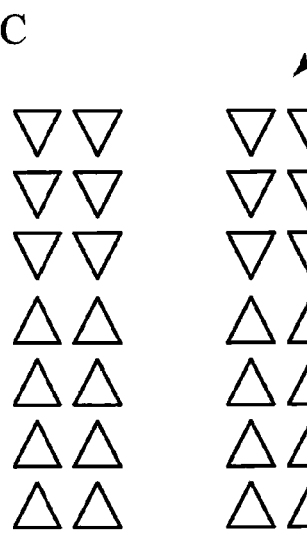
Figure 9D:
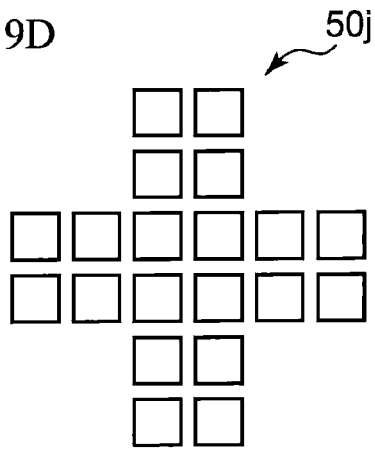

A third embodiment is an example of the conductive pattern. As shown in FIG. 8A, a conductive pattern 50d may have a pattern in which square patterns are arranged. As shown in FIG. 8B, a conductive 50e may have a pattern in which rhombic patterns are arranged. As shown in FIG. 8C, a conductive pattern 50f may have a pattern in which ellipse patterns are arranged. As shown in FIG. 9A, a conductive pattern 50g may have a pattern in which triangle patterns are arranged. As shown in FIG. 9B, a conductive pattern 50h may have a pattern in which divided patterns are doubly arranged. As shown in FIG. 9C, a conductive pattern 50i may have a pattern in which divided patterns are arranged in two lines. As shown in FIG. 9D, a conductive pattern 50j may have a pattern in which divided patterns are arranged in a cross shape. The conductive pattern may have any shape if bonders or the like can be image-recognized. Light for image-recognition is generally visible light and may be light except for visible light such as infrared light.

[Fourth Embodiment]

Figure 10A:
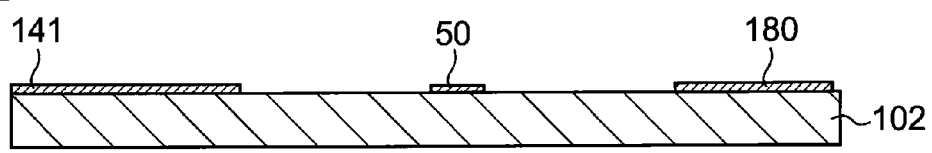
FIG. 10A through FIG. 10D illustrate a manufacturing process in accordance with a fourth embodiment.

A fourth embodiment is an example of a manufacturing method of forming an inductor and a capacitor on a substrate. As shown in FIG. 10A, the lower electrode 141 of an MIM (Metal Insulator Metal) capacitor and a metal layer 180 acting as a lower layer of the conductive pattern 50 and the pad are formed with a sputtering method or a vapor deposition method. The substrate 102 may be made of an insulating substrate such as quartz (including synthetic quartz), glass (pyrex (registered trademark), tempax, alumino silicate, borosilicate glass) and ceramics, or a high-resistance silicon substrate. The substrate 102 may be made of a high-resistance Si substrate, a $LiNbO_3$ substrate, or a $LiTaO_3$ substrate. It is preferable that the metal layer 180 is made of relatively low-resistance metal such as Al, Au or Cu. The metal layer 180 may be a multiplayer structure. The metal layer may have a four-layer structure of Ti/Au/Ni/Au (20 nm/500 nm/20 nm/500 nm) or a three-layer structure of Ti/Cu/Ti (20 nm/1000 nm/20 nm) in order from the substrate 102.

Figure 10B:
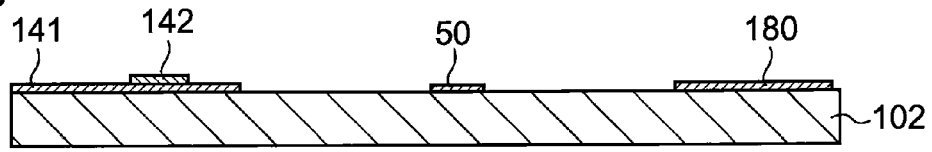
Figure 10C:
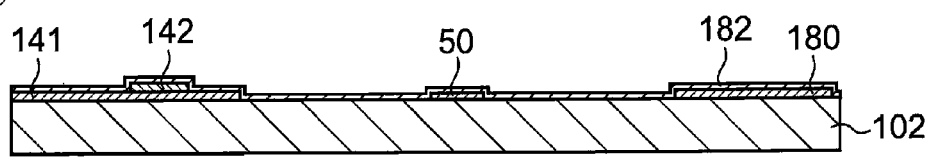

As shown in FIG. 10B, the dielectric layer 142 is formed on the lower electrode 141 with a sputtering method or a PECVD (Plasma Enhanced Chemical Vapor Deposition) method. The dielectric layer 142 may be made of $SiO_2$, $Si_3N_4$, $Al_2O_3$ or $Ta_2O_5$. For example, the dielectric layer 142 is a $SiO_2$ membrane having thickness of 195 nm formed with the PECVD method. As shown in FIG. 10C, a seed layer 182 for electrolytic plating is formed. It is preferable that the seed layer 182 is made of a material for the electrolytic plating. For example, Ti/Cu (20 nm/500 nm) is formed as the seed layer 182 with the sputtering method.

Figure 10D:
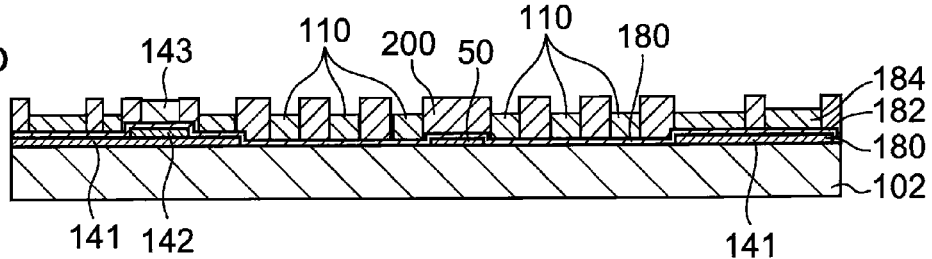

As shown in FIG. 10D, a photo resist 200 is formed having an opening for the plating on the seed layer 182. The electrolytic plating is performed in the opening. This results in a formation of a plated layer 184 made of Cu having thickness of 10 μm.

Figure 11A:
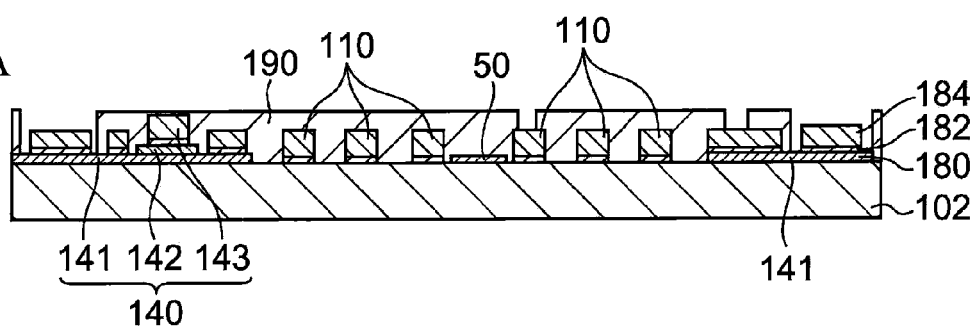
FIG. 11A through FIG. 11C illustrate the manufacturing process in accordance with the fourth embodiment.

As shown in FIG. 11A, the photo resist 200 is removed. The seed layer 182 is removed with use of the plated layer 184 as a mask. The inductor 110, the upper electrode 143, the pad or the like are formed with the plated layer 184 and the seed layer 182. The capacitor 140 is made of the lower electrode 141, the dielectric layer 142 and the upper electrode 143. A thick dielectric layer 190 having an even top face is formed so as to cover the plated layer 184. The thick dielectric layer 190 may be made of polyimide, BCB (Benzocyclobutene) or the like. A given region of the thick dielectric layer 190 to be the pad is removed.

Figure 11B:
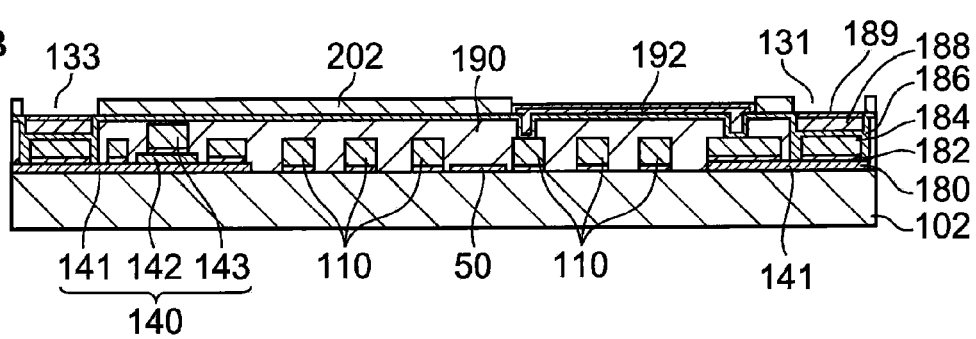

As shown in FIG. 11B, a seed layer 186 having the same thickness as the seed layer 182 is formed on the thick dielectric layer 190. A photo resist 202 having an opening on the seed layer 186 is formed. Electrolytic plating is performed in the opening of the photo resist 202. This results in a formation of a plated layer 188 made of Cu having thickness of 10 μm. A surface layer 189 made of Ni/Au is formed on the plated layer 188.

Figure 11C:
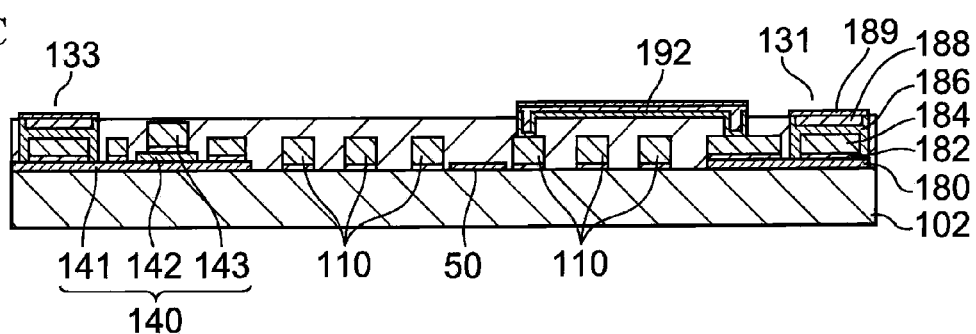

As shown in FIG. 11C, the photo resist 202 is removed. The seed layer 186 is removed with use of the surface layer 189 as a mask. The pads 131 and 133 and an upper wire 192 are made of the seed layer 186, the plated layer 188 and the surface layer 189. With the processes, the integrated passive device in accordance with the fourth embodiment is manufactured. The inductor 110 has a spiral-shaped coil of a single layer, similarly to Japanese Patent Application Publication No. 2006-157738. The inductor 110 may have a spiral-shaped coil of a single layer. The inductors may be coils that are spaced from each other in a longitudinal direction and are electrically connected to each other.

In accordance with the fourth embodiment, as shown in FIG. 10A, the conductive pattern 50 is formed together with the lower electrode 141 of the capacitor 140 formed on the substrate 102. That is, the conductive pattern 50 is made of the same material as the lower electrode 141. It is therefore possible to simplify the manufacturing process. It is preferable that the top face of the conductive pattern 50 is even in order to enlarge the optical reflectivity of the conductive pattern 50. It is therefore preferable that the conductive pattern 50 is formed with the sputtering method or the vapor deposition method.

The inductor device in accordance with the first embodiment and the second embodiment may be manufactured with the method disclosed in Japanese Patent Application Publication No. 2006-157738. In this case, it is possible to form the conductive pattern together with the lower electrode of the capacitor, similarly to the fourth embodiment.

[Fifth Embodiment]

Figure 12:
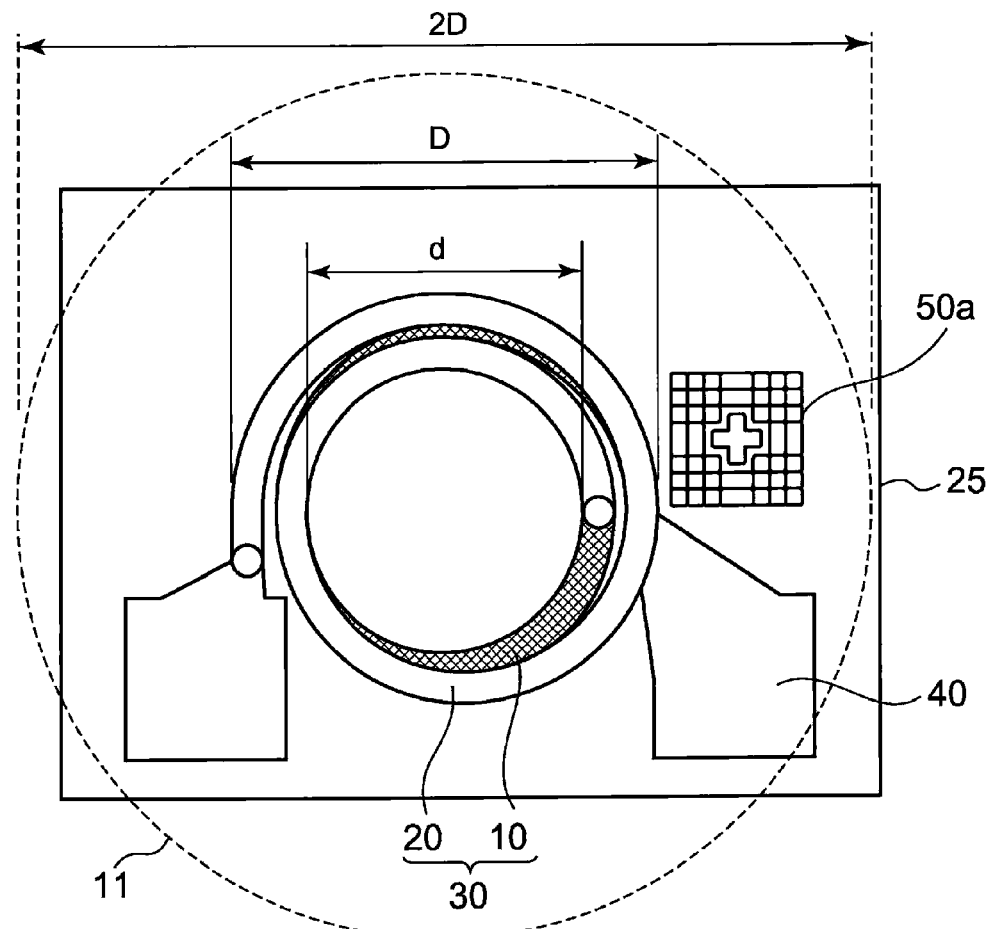
FIG. 12 illustrates a top view of an inductor device in accordance with a fifth embodiment.

A fifth embodiment is an example where a conductive pattern is out of a coil. FIG. 12 illustrates a top view of an inductor device in accordance with the fifth embodiment. As shown in FIG. 12, the conductive pattern 50a is formed out of the inductor 30, being different from FIG. 2 of the first embodiment. The conductive pattern 50a is formed from the circumference of the inductor 30 to inside of a circular 11 (having a diameter of 2D) outward by D/2. Here, "D" is a diameter of the inductor 30. Magnetic field of the inductor 30 is generated out of the inductor 30. The magnetic field of the inductor 30 ranges to a distance of radius of the inductor 30. It is effective that the conductive pattern is divided into pieces, in a case where the conductive pattern 50a is formed from the circumference of the inductor 30 (the first coil 10 and the second coil 20) to the distance of the radius of the inductor 30. It is possible to restrain the reduction of the Q value and the inductance value of the inductor 30.

It is preferable that the conductive pattern may be made of high-melting point metal having high adhesiveness to the substrate, for example metal such as Ti, Cr, Ni, Mo, Ta, W or alloy including at least one of Ti, Cr, Ni, Mo, Ta, W. In particular, it is more preferable that the conductive pattern is made of Ti/Au/Ti, Ti/Cu/Ti, Cr, Ni/Au or Cu. In this case, it is possible to reduce high-frequency resistance of the conductive pattern. And it is possible to improve the adhesiveness with the substrate. And it is possible to improve the adhesiveness between the lower electrode and the dielectric layer of the capacitor if the conductive pattern is made of the same material as the lower electrode of the capacitor.

The present invention is not limited to the specifically disclosed embodiments, but variations and modifications may be made without departing from the scope of the present invention.

The present application is based on Japanese Patent Application No. 2007-254661 filed on Sep. 28, 2007, the entire disclosure of which is hereby incorporated by reference.

What is claimed is:

1. An electronic device comprising:
   a substrate;
   a coil that has a spiral shape and is provided on the substrate; and
   a conductive pattern that is provided inside of the coil, has an optical reflectivity that is higher than that of a surface of the coil, and is divided into pieces;
   all the pieces of the conductive pattern being separate from the coil;
   wherein the coil is structured with a plurality of coils that are spaced from each other in a longitudinal direction and are electrically connected to each other.

2. The electronic device as claimed in claim 1, wherein the conductive pattern divided into pieces acts as a marker for localization.

3. The electronic device as claimed in claim 1, wherein the conductive pattern divided into pieces acts as a marker for image recognition.

4. The electronic device as claimed in claim 1, wherein each piece of the conductive pattern has one of round shape, rectangular shape, triangle shape, rhombic shape and elliptical shape.

5. The electronic device as claimed in claim 1 further comprising a capacitor provided on the substrate, wherein the conductive pattern is made of the same material as a lower electrode of the capacitor.

6. The electronic device as claimed in claim 1, wherein the coil is made of a plated layer.

7. An electronic device comprising:
   a substrate;
   a coil that has a spiral shape and is provided on the substrate; and
   a conductive pattern that is divided into pieces and provided in a range from a circumference to a distance of a radius of the coil, has an optical reflectivity higher than that of a surface of the coil, and acts as a marker for localization wherein the conductive pattern is for image recognition;
   all the pieces of the conductive pattern are separate from the coil;
   wherein the coil is structured with a plurality of coils that are spaced from each other in a longitudinal direction and are electrically connected to each other.

* * * * *